United States Patent
Lien et al.

(10) Patent No.: US 7,560,800 B1
(45) Date of Patent: Jul. 14, 2009

(54) DIE SEAL WITH REDUCED NOISE COUPLING

(75) Inventors: Chuen-Der Lien, Los Altos Hills, CA (US); Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 94 days.

(21) Appl. No.: 11/459,820

(22) Filed: Jul. 25, 2006

(51) Int. Cl.
*H01L 29/06* (2006.01)
(52) U.S. Cl. .................... 257/619; 257/173; 257/508; 257/618; 257/758; 257/E23.194; 257/E21.575
(58) Field of Classification Search .................. 257/173, 257/620, 635, 637, 700, 758, 508, E23.194, 257/618, 619, E21.575
See application file for complete search history.

(56) References Cited

U.S. PATENT DOCUMENTS

| 6,492,716 | B1 | 12/2002 | Bothra |
| 2003/0071280 | A1* | 4/2003 | Yu ............................. 257/200 |
| 2005/0098893 | A1* | 5/2005 | Tsutsue et al. .............. 257/758 |
| 2005/0110118 | A1 | 5/2005 | Udupa |
| 2006/0206277 | A1* | 9/2006 | Horch ......................... 702/82 |

* cited by examiner

*Primary Examiner*—Long K Tran
(74) *Attorney, Agent, or Firm*—Kenneth Glass; Glass & Associates

(57) ABSTRACT

A die seal structure for sealing integrated circuit devices formed on a semiconductor substrate. The die seal structure includes a die seal and a junction diode. The die seal only connects to the semiconductor substrate through the junction diode, thereby reducing noise coupling through the die seal. In another aspect of the present invention the die seal structure includes a die seal and a bipolar structure. In this embodiment the die seal only connects to the semiconductor substrate through the bipolar structure.

10 Claims, 6 Drawing Sheets

US 7,560,800 B1

DIE SEAL WITH REDUCED NOISE COUPLING

BACKGROUND OF THE INVENTION

Die seals are typically used to protect the circuitry inside the die seal from stress induced damage caused by the packaging process and harmful impurities such as mobile ions and moisture.

Since the die seal contains all the metal layers used in the IC device process flow, it serves as a good conducting path. For this reason, sometimes, the die seal is used as a ground bus, with ohmic contact to the semiconductor substrate. Though this provides a good conducting path for all of the metal layers, it can transport substrate noise from one region of a chip with high noise, such as s digital circuit block, to another region on the same die that requires very low noise, such as a region containing analog circuitry.

One prior art method for reducing noise coupling through the die seal is to cut the die seal into several portions. Though this alleviates the noise coupling problem, contaminants can enter through the gaps in the die seal, damaging the internal circuitry.

Another prior art method is to insert a polysilicon layer and gate oxide between the first layer of interconnects and the substrate. Though this isolates the gate from substrate noise, contaminants can enter through the polysilicon layer and the gate oxide layer, damaging the internal circuitry.

Accordingly, there is a need for a die seal and a method for forming a die seal that will provide an effective seal against contaminants and that will reduce noise coupling between different regions in the integrated circuit device.

SUMMARY OF THE INVENTION

In accordance with one embodiment of the present invention, a die seal structure is disclosed that includes a junction diode. The die seal extends over the junction diode, and only electrically couples to the semiconductor substrate through the junction diode. The junction diode effectively isolates the die seal from the semiconductor substrate, eliminating noise coupling through the die seal.

In another embodiment of the present invention a die seal structure is disclosed that includes a bipolar structure. The bipolar structure includes a first doped region that is doped with the opposite type of dopant as the substrate and a second doped region that is doped with the same type of dopant as the semiconductor substrate, the second doped region extending entirely within the first doped region. The die seal extends over the second doped region, and only couples to the semiconductor substrate through the second doped region. The bipolar structure electrically isolates the die seal from noise coupled through the substrate, preventing noise coupling through the die seal.

In the present embodiment the die seal is formed by stacking each metal layer and via layer in the fabrication process so as to form a metal "wall" that extends from the top of the semiconductor substrate to the last metal layer used in the fabrication process, and that extends completely around the integrated circuit devices. Because the die seal is in direct contact with the top surface of semiconductor substrate 1, and because die seal is exclusively formed of metal layers, it effectively protects the enclosed integrated circuit devices from stress-induced damage caused by the packaging process and from harmful impurities such as mobile ions and moisture.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

Figure 1:
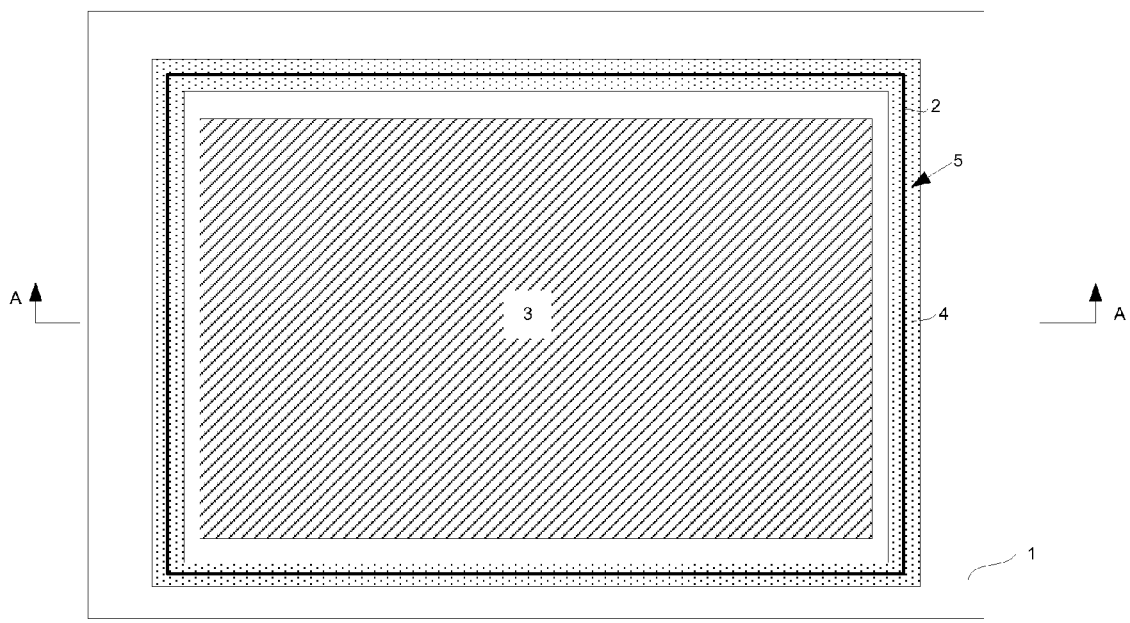
FIG. 1 is a top view of a semiconductor substrate on which integrated circuit devices are formed and on which a die seal structure has been formed that extends completely around the semiconductor devices, where the die seal structure includes both a die seal and a junction diode, and in which the pre-metal dielectric layer and inter-metal dielectric layers are not illustrated, in accordance with an embodiment of the present invention.
Figure 2:
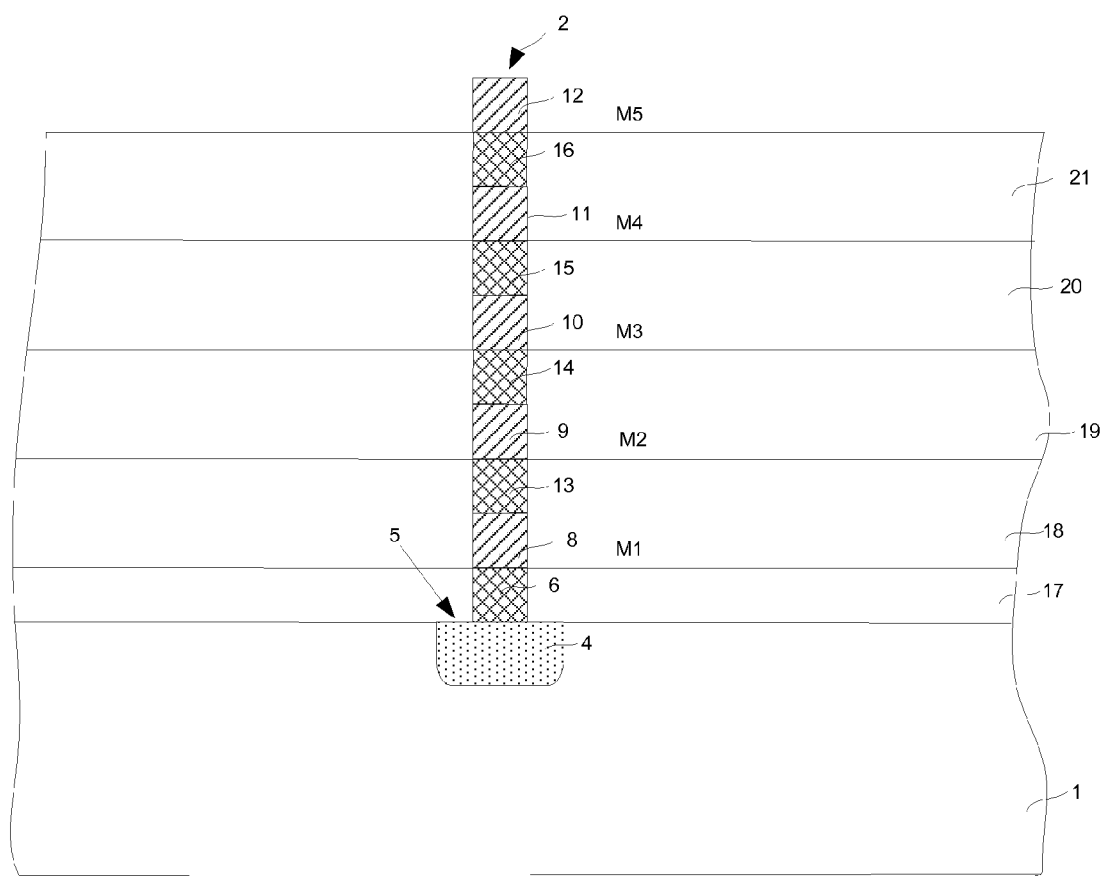
FIG. 2 is a cross-sectional view of a portion of the semiconductor substrate of FIG. 1 along cross section A-A, showing a die seal structure in accordance with an embodiment of the present invention.

FIGS. 1-2 show a die seal structure that includes a die seal 2 and a junction diode 5. Junction diode 5 includes a doped region 4 that is doped with the opposite type of dopant as semiconductor substrate 1. In the present embodiment junction diode 5 is formed by performing a doping process so as to dope a region of semiconductor substrate 1 with a dopant having the opposite dopant type as semiconductor substrate 1. This forms a doped region 4 within semiconductor substrate 1 that extends completely around integrated circuit devices 3. More particularly, when semiconductor substrate 1 is a P type substrate, doped region 4 is an N+ type region. When semiconductor substrate 1 is an N type substrate, doped region 4 is a P+ type region.

In the present embodiment doped region 4 is formed during the normal process flow for forming integrated circuit devices 3, using process steps that are used to form integrated circuit devices 3. Accordingly, no additional process steps are required and no additional materials are required for forming doped region 4.

Die seal 2 is then formed over junction diode 5 such that the portion of die seal 2 that is in direct contact with semiconductor substrate 1 extends entirely within doped region 4. Thereby, die seal 2 is electrically isolated from substrate 1 by diode 5. Accordingly, substrate noise does not conduct from semiconductor substrate 1 into die seal 2, preventing noise from coupling through the die seal from one region of integrated circuit devices 3 to a different region of integrated circuit devices 3.

In the present embodiment die seal 2 is formed by stacking each metal layer and via layer in the process flow so as to form a metal "wall" that extends from the top of the semiconductor substrate to the last metal layer used in the fabrication process. The top of the semiconductor can then be sealed using a conventional sealing layer, as is well known in the art.

Referring now to FIG. 2, die seal 2 can be formed by depositing a pre-metal dielectric layer 17 over the semiconductor substrate, and etching pre-metal dielectric layer 17 so as to form an opening that exposes some of doped region 4. In the present embodiment the opening extends completely around the integrated circuit devices. A metal layer is then deposited such that it extends within the opening and a chemical mechanical polishing process is performed, forming contact 6 that extends within the opening, and that is in direct contact with the top surface of the semiconductor substrate 1.

A first metal layer is then deposited over pre-metal dielectric layer 17 such that it overlies, and directly contacts the top of contact 6. This first metal layer is patterned, a dielectric layer is deposited, and the surface is planarized (e.g., using a chemical-mechanical polishing process) to form first metal layer 8. Another layer of dielectric material is then deposited and etched to form an opening that extends around integrated circuit devices 3 so as to expose the top of first metal layer 8. A layer of metal is then deposited so as to fill the opening and the surface is again planarized (e.g., using a chemical-mechanical polishing process) to form via 13. The remaining inter-metal dielectric material, shown as inter-metal dielectric layer 18, provides a planar surface over which the second metal layer 9 is deposited. Overlying metal layers 9-12, inter-metal dielectric layers 19-21, and vias 14-16 are then formed in the same manner, producing the die seal structure 2 shown in FIG. 2.

Continuing with FIG. 2, in the present embodiment die seal 2 includes metal layers 8-12. It is appreciated that the die seal can have more or fewer metal layers, depending on the integrated circuit devices 3 that are formed. In the present embodiment the number of metal layers is the same as the number of metal layers used to form integrated circuit devices 3.

Die seal 2 also includes vias 13-16 that extend between adjoining metal layers for electrically and mechanically coupling adjoining metal layers. More particularly, via 13 extends between first metal layer 8 and second metal layer 9; via 14 extends between second metal layer 9 and third metal layer 10; via 15 extends between third metal layer 10 and fourth metal layer 11; and via 16 extends between fourth metal layer 11 and fifth metal layer 12.

A pre-metal dielectric layer 17 extends between semiconductor substrate 1 and first metal layer 8. Inter-metal dielectric layers 18-21 extend between adjoining metal layers. More particularly, inter-metal dielectric layer 18 extends between first metal layer 8 and second metal layer 9; inter-metal dielectric layer 19 extends between second metal layer 9 and third metal layer 10; inter-metal dielectric layer 20 extends between third metal layer 10 and fourth metal layer 11; and inter-metal dielectric layer 21 extends between fourth metal layer 11 and fifth metal layer 12.

Contact 6 extends around integrated circuit devices 3, between first metal layer 8 and the top surface of semiconductor substrate 1. Contact 6 overlies and is in direct contact with the top surface of semiconductor substrate 1 within doped region 4. Contact 6 only electrically couples to the semiconductor substrate through junction diode 5. More particularly, because that portion of the contact 6 that is in direct contact with the semiconductor substrate 1 extends entirely within the doped region 4; the die seal 2 is electrically isolated from substrate 1 by diode 5. Thereby, substrate noise does not travel from substrate 1 to contact 6, preventing noise from coupling through the die seal 2 from one region of integrated circuit devices 3 to a different region of integrated circuit devices 3.

In the present embodiment doped region 4 extends completely around integrated circuit devices 3, forming a diode 5 that extends completely around integrated circuit devices 3. Moreover, die seal 2 extends completely around integrated circuit devices 3. Because die seal 2 extends immediately above, and is in direct contact with the top surface of semiconductor substrate 1, and because die seal 2 is exclusively formed of metal layers, it effectively protects integrated circuit devices 3 from stress-induced damage caused by the packaging process and from harmful impurities such as mobile ions and moisture.

In the present embodiment, the die seal structure is formed such that there is high resistance and low capacitance (high capacitive impedance) between die seal 2 and semiconductor substrate 1 to isolating die seal 2 from noise in substrate 1. More particularly, diode 5 has intrinsic parasitic capacitance that is determined by the level of doping. Higher doping results in a smaller depletion region width and higher capacitance. In the present embodiment a low dose implant is used to form diode 5. The low dose implant increases the contact resistance and reduces the intrinsic diode capacitance, producing a die seal structure with high contact resistance and low capacitance. In one specific embodiment diode 5 is formed using a low dose implant such as an NWELL implant with a dose of less than $6E13$ ions/cm$^2$, producing a diode 5 having a resistance of greater than 400 ohms/sq.

In the present embodiment die seal 2 is formed during the normal process flow for forming integrated circuit devices 3.

More particularly, the same materials and fabrication process steps used to form integrated circuit devices 3 are used to form die seal 2. Accordingly, die seal 2 will have the same number of metal layers as integrated circuit devices 3. Since both diode 5 and die seal 2 utilize process steps in the process flow for forming integrated circuit devices 3, the method and apparatus of the present invention does not add process steps or different materials to the process flow. Thereby, an effective seal is obtained, without adding significant cost to the semiconductor fabrication process.

Figure 3:
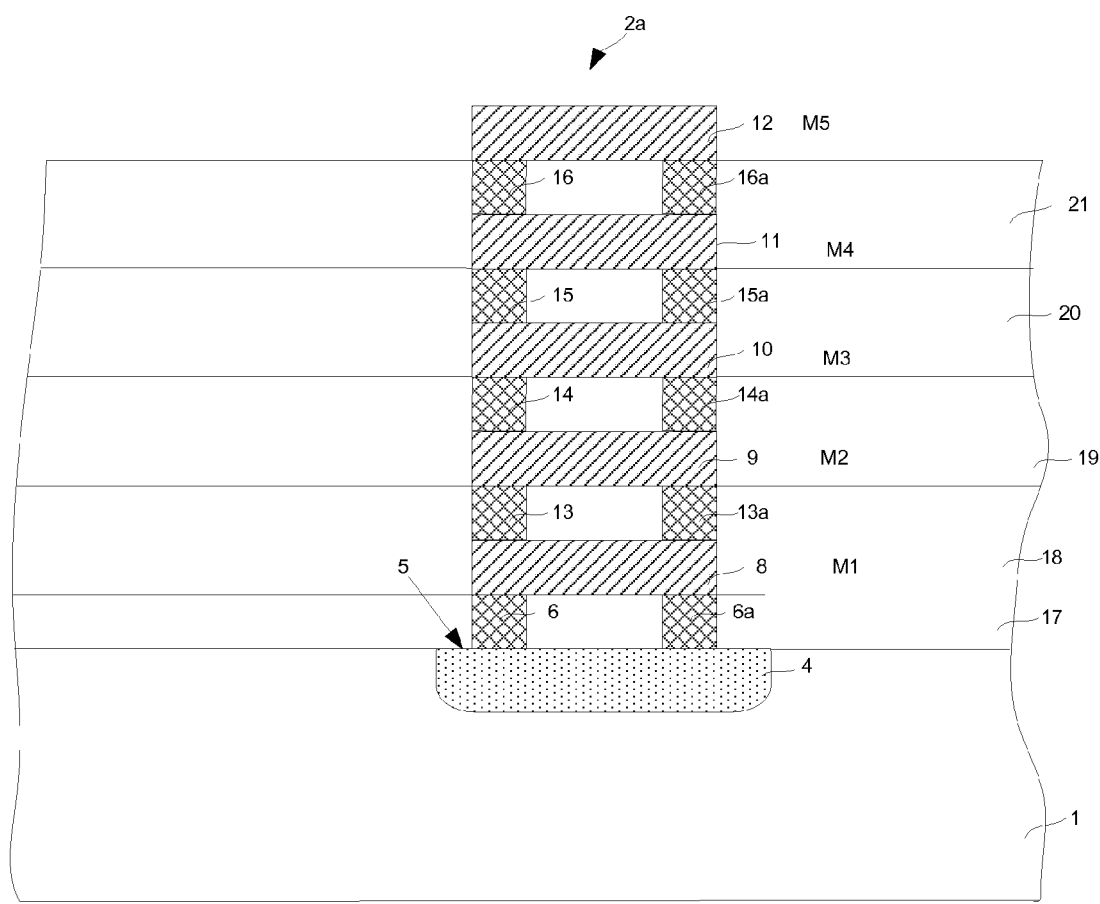
FIG. 3 is a cross-sectional view of an embodiment in which the die seal includes two contacts and two sets of vias, and in which metal layers extend between the two contacts, in accordance with an embodiment of the present invention.

Though the die seal of FIGS. 1-2 is shown to only include one contact, alternatively more than one contact can be used. FIG. 3 illustrates an alternate embodiment in which two contacts are used, with both contacts contacting the surface of semiconductor substrate 1 within doped region 4. More particularly, in one embodiment a second contact 6a is formed in the same manner as contact 6, such that both contact 6 and contact 6a extend within doped region 4. A second set of vias, shown as vias 13a, 14a, 15a and 16a are formed over contact 6a such that they directly overlie contact 6. In the present embodiment vias 13a, 14a, 15a and 16a are formed at the same time and in the same manner as vias 13-16, respectively, so as to electrically couple contact 6a to each of metal layers 9-12. In this embodiment metal layers 8-12 extend between contact 6 and contact 6a, forming a die seal 2a having high structural strength. That portion of contact 6a that is in direct contact with semiconductor substrate 1 extends entirely within the doped region 4, such that die seal 2a only electrically couples to the semiconductor substrate through junction diode 5.

Figure 4:
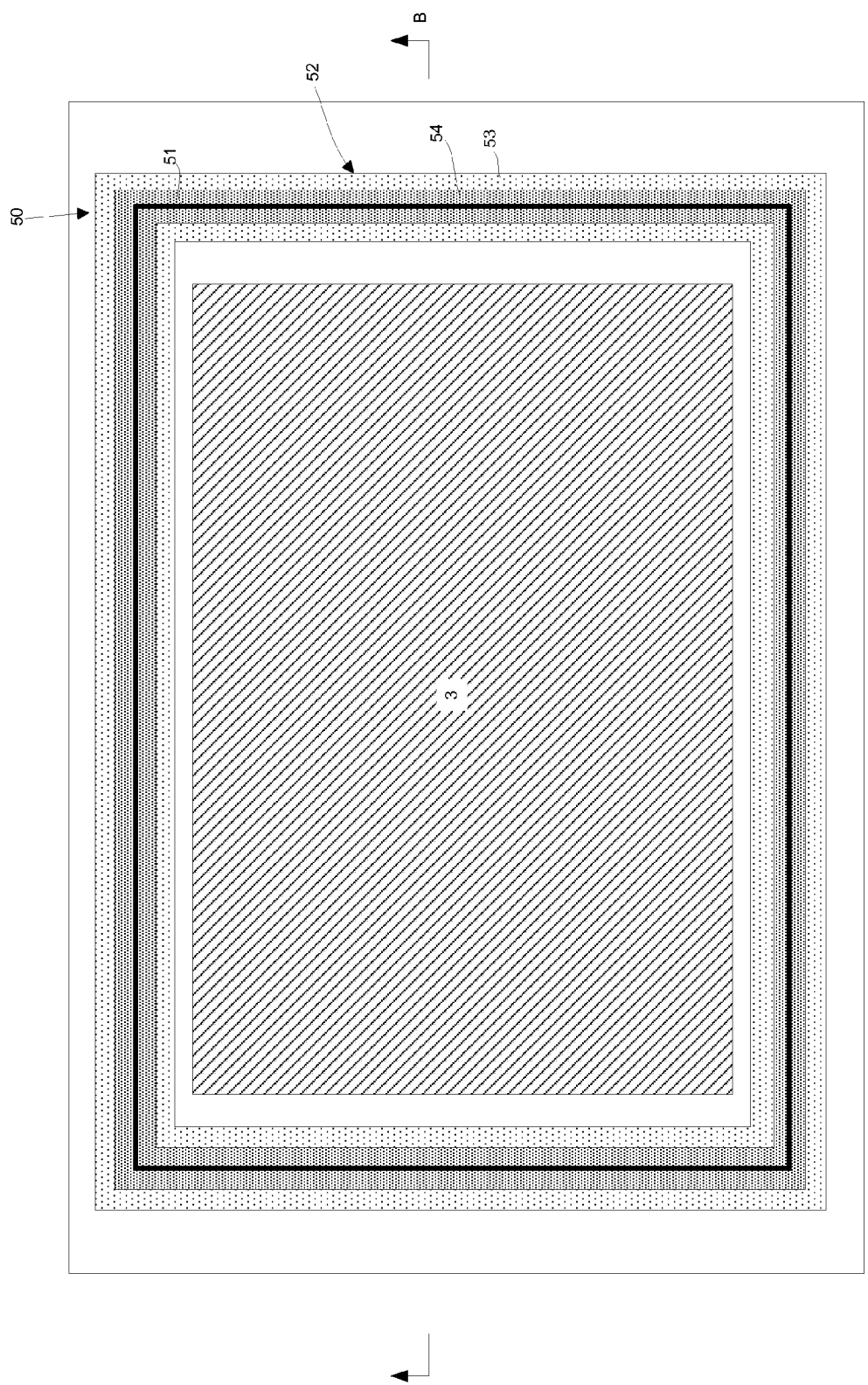
FIG. 4 is a top view of a semiconductor substrate on which integrated circuit devices are formed and on which a die seal structure has been formed that extends completely around the semiconductor devices, where the die seal structure includes both a die seal and a bipolar structure, and in which the pre-metal dielectric layer and inter-metal dielectric layers are not illustrated, in accordance with an embodiment of the present invention.

Referring now to FIG. 4 a die seal structure 50 is shown that includes a die seal 51 and a bipolar structure 52 that is formed within semiconductor substrate 1. Bipolar structure 52 includes a first doped region 53 that is doped with the opposite type of dopant as substrate 1 and a second doped region 54 that is doped with the same type of dopant as semiconductor substrate 1. The second doped region 54 extends entirely within first doped region 53. In the present embodiment doped regions 53-54 extend completely around integrated circuit devices 3, forming a bipolar structure 52 that extends completely around integrated circuit devices 3.

In the present embodiment bipolar structure 52 is formed by performing a doping process so as to dope a region of the semiconductor substrate with a dopant having the opposite dopant type as the semiconductor substrate, forming a doped region 53 within semiconductor substrate 1 that extends completely around the integrated circuit devices 3. More particularly, when semiconductor substrate 1 is a P type substrate, doped region 53 is an N type region. When semiconductor substrate 1 is an N type substrate, doped region 4 is a P type region.

A second doping process is then performed as to dope a region 54 of the semiconductor substrate with a dopant having the same dopant type as the semiconductor substrate 1. In the present embodiment this forms a doped region 54 within semiconductor substrate 1 that extends completely around the integrated circuit devices 3. More particularly, when semiconductor substrate 1 is a P type substrate, doped region 53 is an N type region and doped region 54 is a P type region. When semiconductor substrate 1 is a P type substrate, doped region 53 is an N type region and doped region 54 is a P type region.

In the present embodiment doped regions 53-54 are formed during the normal process flow for forming integrated circuit devices 3, using process steps that are used to form integrated circuit devices 3. Accordingly, no additional process steps are required and no additional materials are required for forming doped regions 53-54.

In the present embodiment, doped regions 53-54 are formed such that there is high resistance and low capacitance (high capacitive impedance) between die seal 51 and semiconductor substrate 1 to isolating die seal 51 from noise in substrate 1. More particularly, doped regions 53-54 have intrinsic parasitic capacitance that is determined by the level of doping. Higher doping results in a smaller depletion region width and higher capacitance. In the present embodiment a low dose implant is used to form doped regions 53-54. The low dose implant increases the contact resistance and reduces the intrinsic diode capacitance, producing a die seal structure with high contact resistance and low capacitance. In one specific embodiment both of doped regions 53-54 are formed using a low dose (N or P) implant such as an NWELL implant with a dose of less than 6E13 ions/cm$^2$, producing a bipolar structure 52 having a resistance of greater than 400 ohms/sq.

Die seal 51 is formed over bipolar structure 52 such that the portion of die seal 51 that is in direct contact with semiconductor substrate 1 extends entirely within doped region 54. Thereby, die seal 51 is electrically isolated from substrate 1 by bipolar structure 52. More particularly, the NPN structure or PNP structure of bipolar structure 52 can be characterized as back-to back diodes, between contact 6 and the bulk semiconductor substrate, that prevent current (substrate noise) from passing into die seal 51. Accordingly, substrate noise does not conduct from semiconductor substrate 1 into die seal 51, preventing noise from coupling through die seal 52 from one region of integrated circuit devices 3 to a different region of integrated circuit devices 3.

In the present embodiment die seal 51 is formed by stacking each metal layer and via layer in the process flow so as to form a metal "wall" that extends from the top of the semiconductor substrate to the last metal layer used in the fabrication process. The top of the semiconductor can then be sealed using a conventional sealing layer, as is well known in the art.

Figure 5:
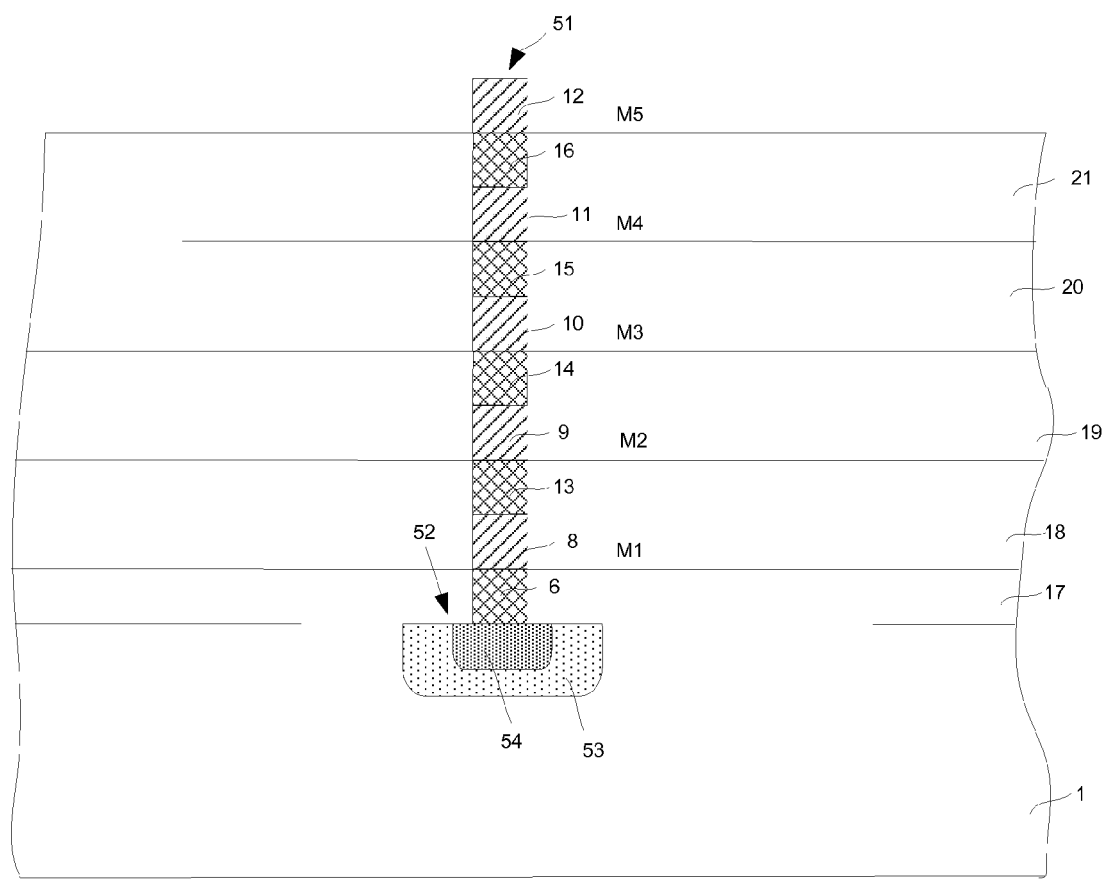
FIG. 5 is a cross-sectional view of a portion of the semiconductor substrate of FIG. 4 along cross section B-B, showing a die seal structure in accordance with an embodiment of the present invention.

In the embodiment shown in FIG. 5, die seal 51 is formed in the same manner as die seal 2 shown in FIGS. 1-2. Die seal 51 includes a contact 6 that extends completely around integrated circuit devices 3, between first metal layer 8 and the top surface of semiconductor substrate 1. Contact 6 overlies and is in direct contact with the top surface of semiconductor substrate 1 within doped region 54. Thereby, die seal 51 only electrically couples to the semiconductor substrate through bipolar structure 52. More particularly, because that portion of contact 6 that is in direct contact with semiconductor substrate 1 extends entirely within doped region 54; die seal 51 is electrically isolated from substrate 1 by bipolar structure 52. Thereby, substrate noise does not travel from substrate 1 to contact 6, preventing noise from coupling through the die seal 2 from one region of integrated circuit devices 3 to a different region of integrated circuit devices 3.

Moreover, die seal 51 extends completely around integrated circuit devices 3. Because die seal 51 extends immediately above, and is in direct contact with the top surface of semiconductor substrate 1, and because die seal 51 is exclusively formed of metal layers, it effectively protects integrated circuit devices 3 from stress-induced damage caused by the packaging process and from harmful impurities such as mobile ions and moisture.

Figure 6:
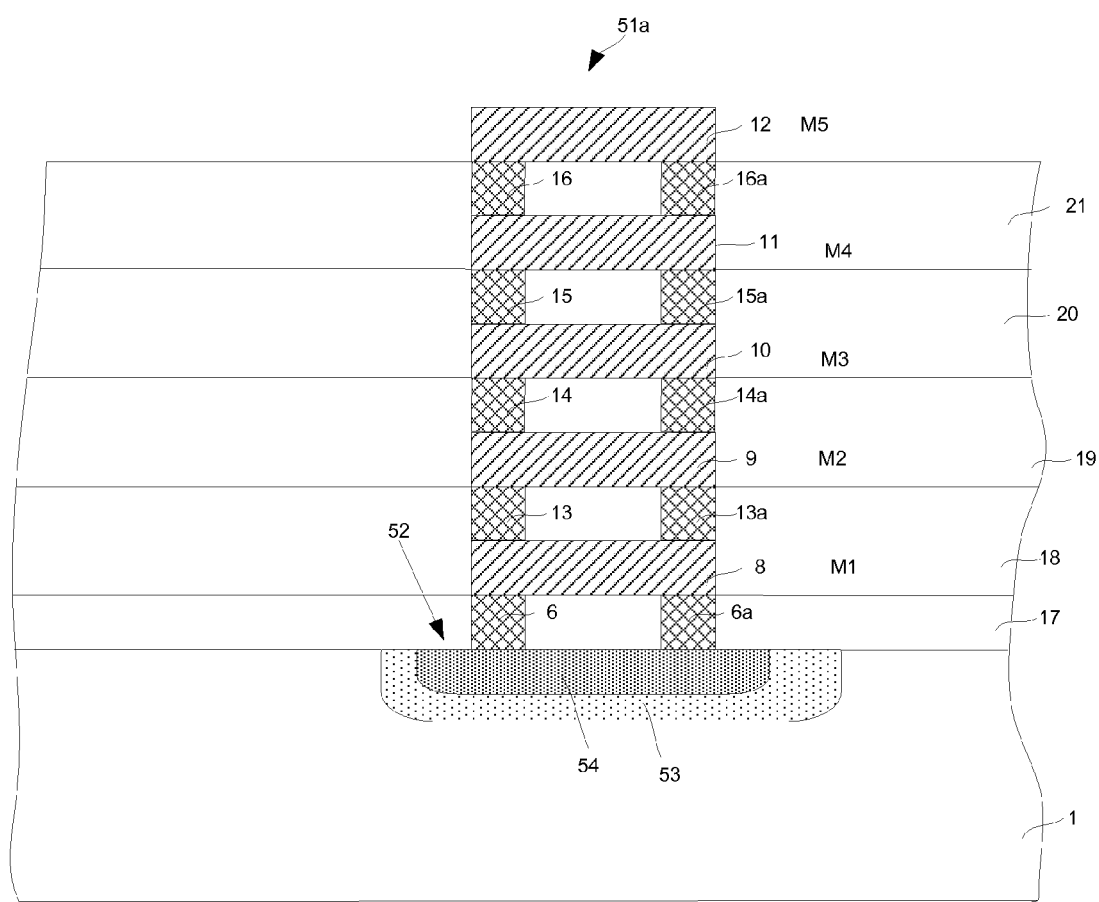
FIG. 6 is a cross-sectional view of an embodiment in which the die seal includes two contacts and two sets of vias, and in which metal layers extend between the two contacts, in accordance with an embodiment of the present invention.
Figure 1:
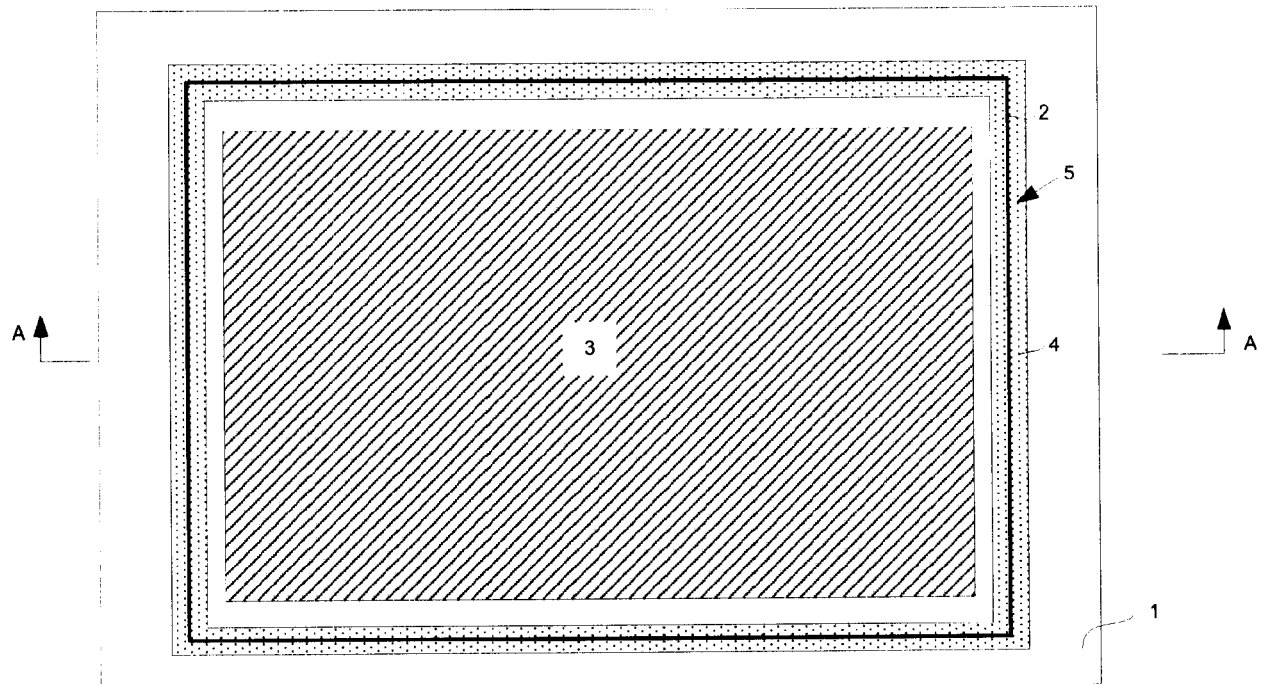
Figure 2:
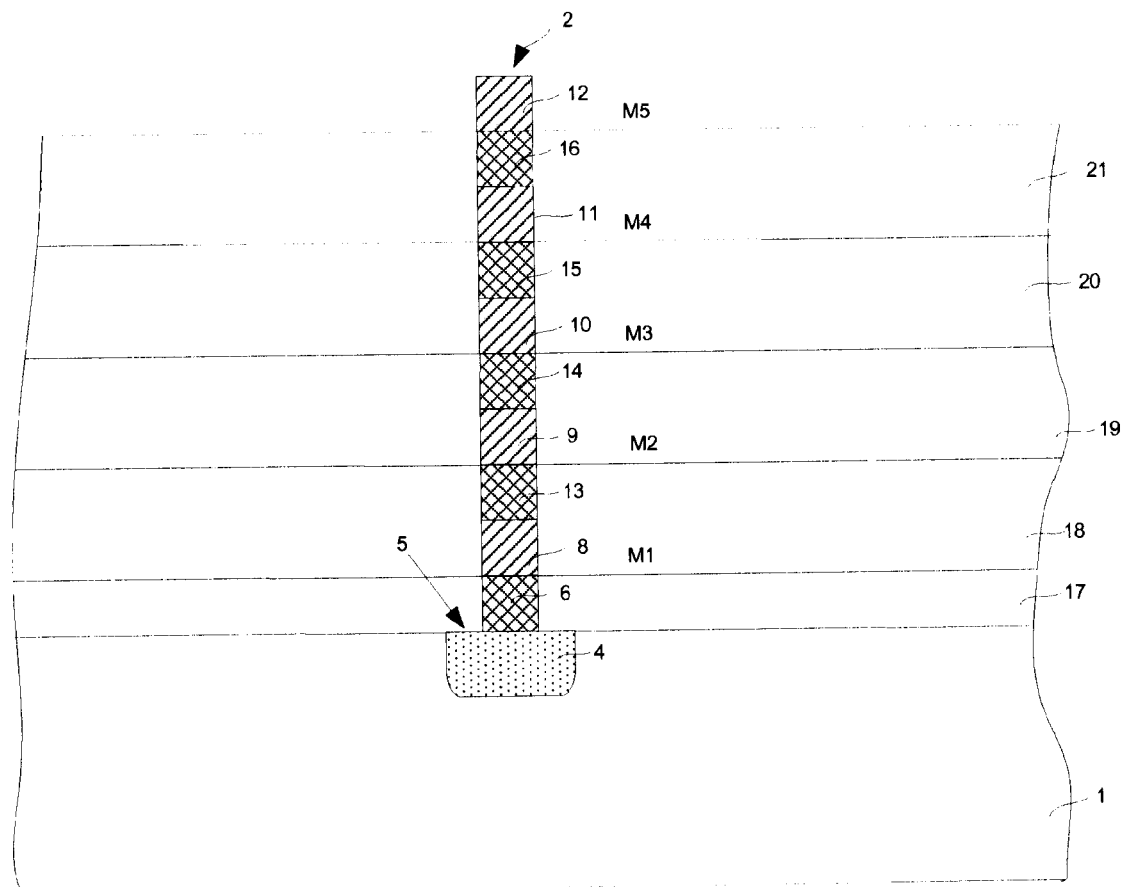
Figure 5:
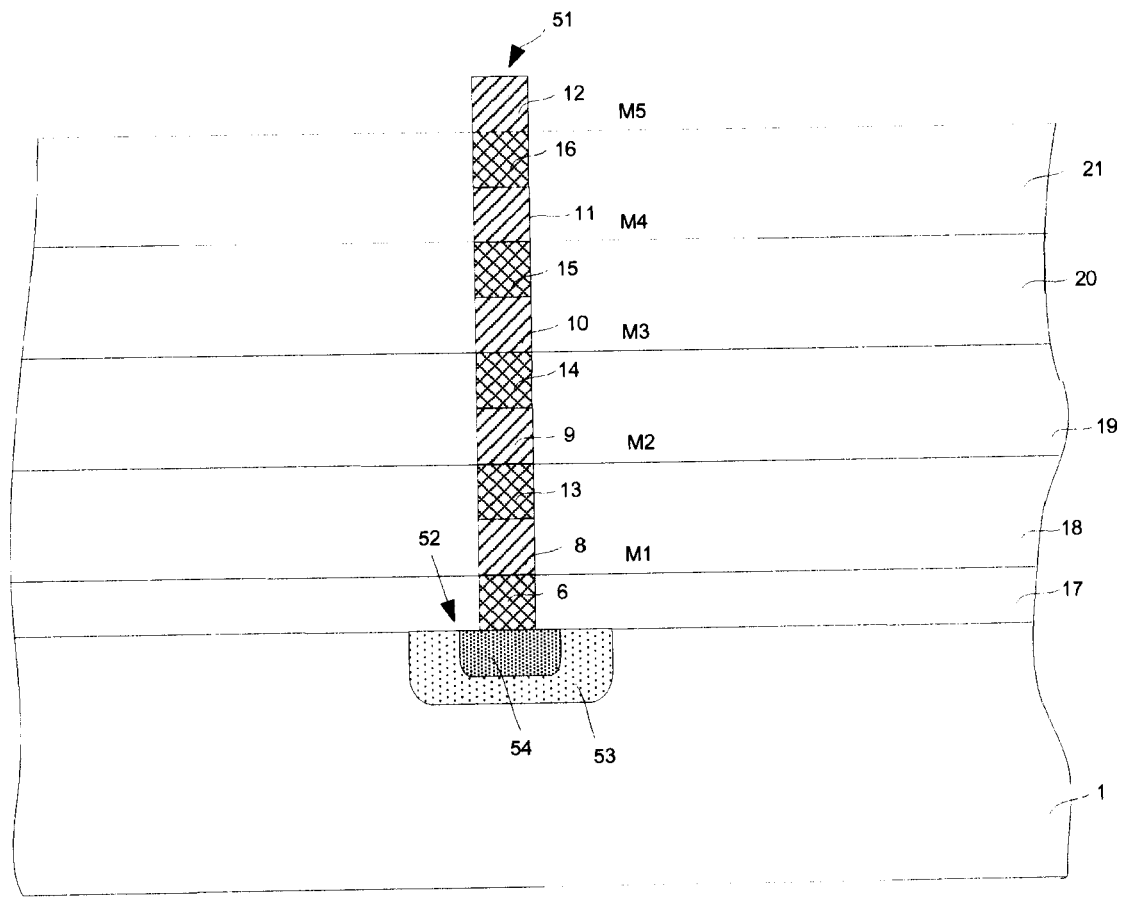
Figure 6:
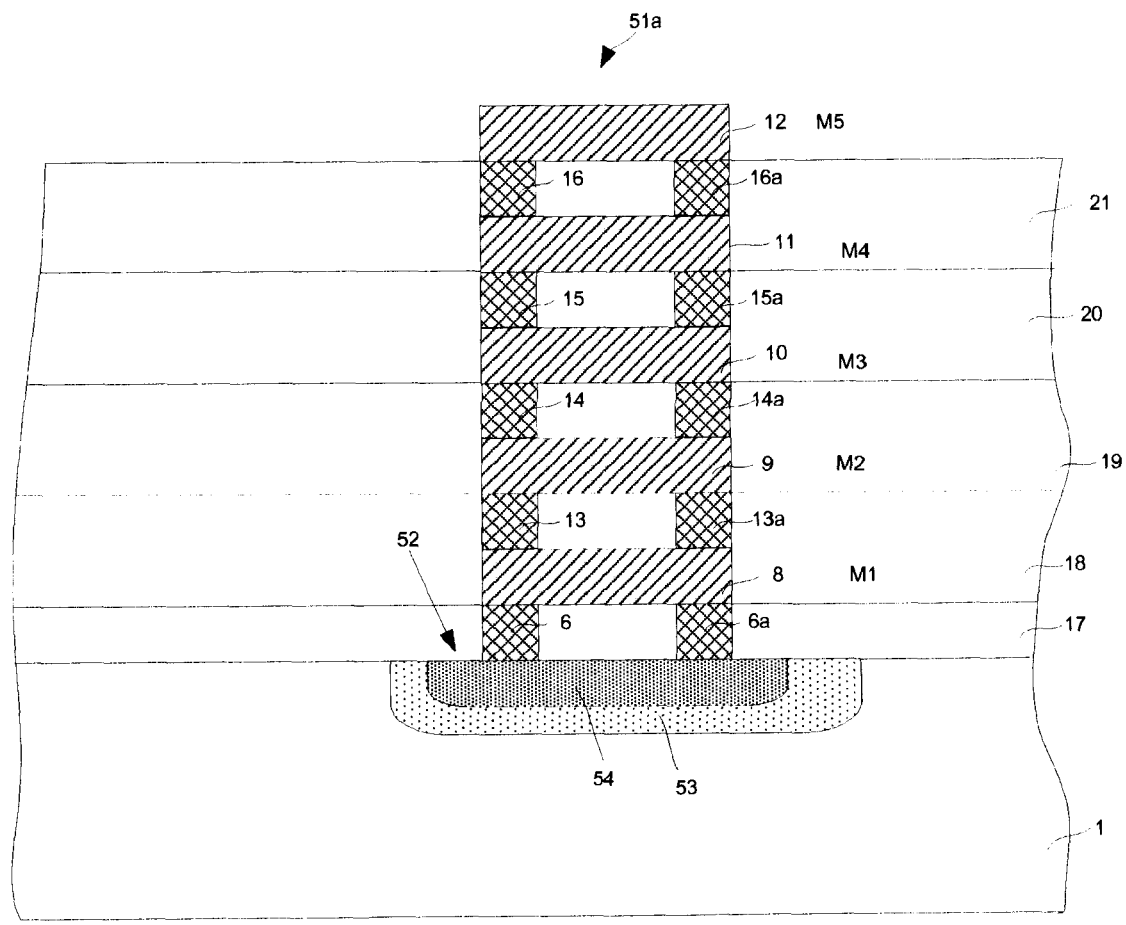

Though the die seal of FIGS. 4-5 is shown to only include one contact, alternatively more than one contact can be used. FIG. 6 illustrates an alternate embodiment in which two contacts are used, with both contacts contacting the surface of integrated circuit device 1 within doped region 54. More particularly, in one embodiment a second contact 6a is formed in the same manner as contact 6, such that both contact 6 and contact 6a extend within doped region 54. A second set of vias, shown as vias 13a, 14a, 15a and 16a are formed over contact 6a such that they directly overlie contact 6. In the present embodiment vias 13a, 14a, 15a and 16a are formed at the same time and in the same manner as vias 13-16, respectively, such that they immediately overlie metal layers 8-12, respectively, and such that they electrically couple contact 6a to each of metal layers 9-12. In this embodiment metal layers 8-12 extend between contact 6 and contact 6a, forming a die seal 2a having high structural strength. Moreover, portion of contact 6a that is in direct contact with semiconductor substrate 1 extends entirely within the doped region 54, such that die seal 51 only electrically couples to the semiconductor substrate through doped region 54.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

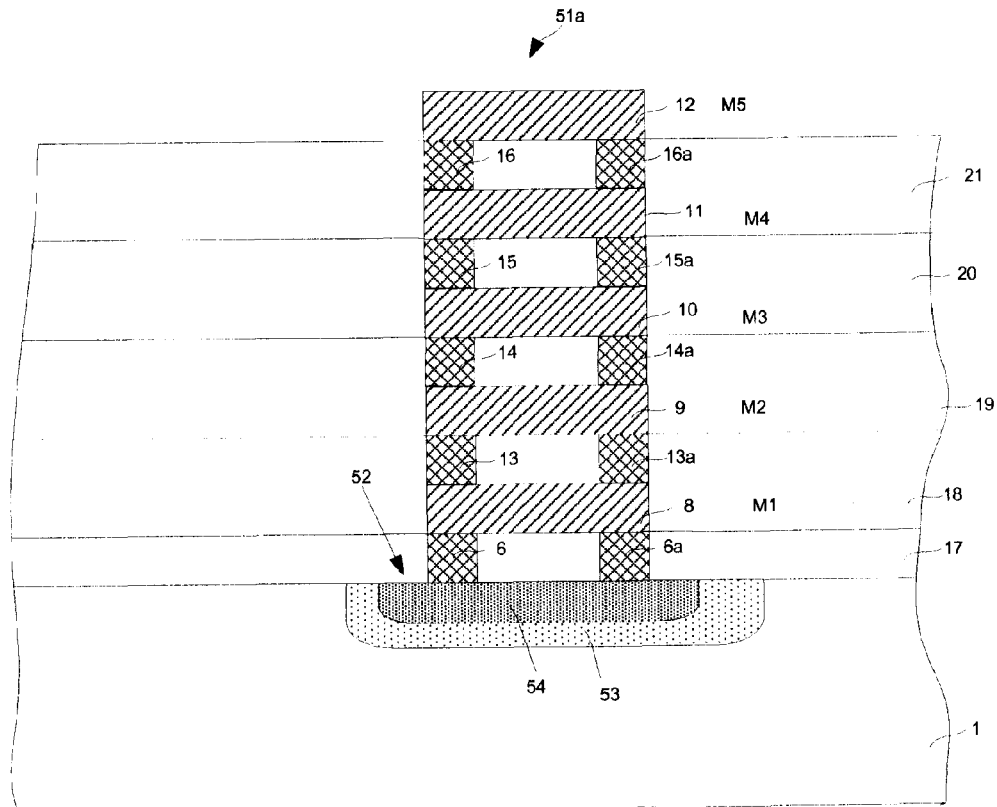

What is claimed is:

1. A die seal structure formed on a semiconductor substrate comprising:
    a junction diode formed within the semiconductor substrate, the junction diode including a doped region that is doped with the opposite type of dopant as the semiconductor substrate;
    a first metal layer, a first portion of the first metal layer extending over the junction diode and extending around integrated circuit devices formed on the semiconductor substrate;
    a first contact that extends around the integrated circuit devices, the first contact coupled to the first portion of the first metal layer, the first contact extending between the first portion of the first metal layer and the top surface of the semiconductor substrate, and only electrically coupling to the semiconductor substrate through the doped region of the junction diode;
    a second contact that extends around the first contact, the second contact coupled to the first portion of the first metal layer and extending between the first portion of the first metal layer and the top surface of the semiconductor substrate, the first portion of the first metal layer extending laterally between the first contact and the second contact, the second contact only electrically coupling to the semiconductor substrate through the doped region of the junction diode;
    a plurality of additional metal layers, a first portion of each of the plurality of additional metal layers extending over the first portion of the first metal layer and extending around the integrated circuit devices, each first portion of an additional metal layer electrically isolated from other portions of each of the plurality of additional metal layers;
    a first plurality of vias, each of the first plurality of vias extending between adjoining metal layers of the first metal layer and the plurality of additional metal layers, the first plurality of vias positioned such that they directly overlie the first contact; and
    a second plurality of vias, each of the second plurality of vias extending between adjoining metal layers of the first metal layer and the plurality of additional metal layers, the second plurality of vias positioned such that they directly overlie the second contact, each first portion of an additional metal layer only electrically coupled to the semiconductor substrate through the junction diode.

2. The die seal structure of claim 1 wherein of the first contact overlies and is in direct contact with the semiconductor substrate, that portion of the first contact that is in direct contact with the semiconductor substrate extending entirely within the doped region of the junction diode.

3. The die seal structure of claim 1, wherein the substrate is a P type substrate and wherein the doped region is an N type region having a dosage of less than 6E13 ions/cm$^2$.

4. The die seal structure of claim 1, wherein the semiconductor substrate is an N type substrate and the doped region is a P type region having a dosage of less than 6E13 ions/cm$^2$.

5. The die seal structure of claim 1, wherein the doped region extends completely around the integrated circuit devices.

6. The die seal structure of claim 1 wherein the second contact overlies and is in direct contact with the semiconductor substrate, that portion of the second contact that is in direct contact with the semiconductor substrate extending entirely within the doped region of the junction diode.

7. A die seal structure formed on a semiconductor substrate comprising:
    a bipolar structure formed within the semiconductor substrate, the bipolar structure including a first doped region that is doped with the opposite type of dopant as the bulk of the semiconductor substrate and a second doped region that is doped with the same type of dopant as the bulk of the semiconductor substrate, the second doped region extending entirely within the first doped region, the first doped region and the second doped region extending around integrated circuit devices formed on the semiconductor substrate; and
    a metal die seal that extends around the integrated circuit devices and that is in direct contact with the top surface of the semiconductor substrate, that portion of the metal die seal that is in direct contact with the top surface of the semiconductor substrate directly contacting the second doped region and extending entirely within the second doped region, the metal die seal comprising:
        a first contact extends around the integrated circuit devices;
        a second contact that extends around the integrated circuit devices, all of the bottom surface of the first contact and the second contact directly contacting the second doped region;
        a first metal layer, a first portion of the first metal layer extending around the integrated circuit devices, the first portion of the first metal layer disposed directly over the first contact, disposed directly over the second contact and extending laterally between the first contact and the second contact, all of the first portion of the first metal layer extending directly over the second doped region;
        a plurality of additional metal layers, a first portion of each of the plurality of additional metal layers extending over the first portion of the first metal layer and extending around the integrated circuit devices;
        a first plurality of vias, each of the first plurality of vias extending between adjoining metal layers of the first metal layer and the plurality of additional metal layers so as to electrically couple the first portion of each additional metal layer to the second doped region, the first plurality of vias positioned such that they directly overlie the first contact; and
        a second plurality of vias, each of the second plurality of vias extending between adjoining metal layers of the first metal layer and the plurality of additional metal layers so as to electrically couple the first portion of each additional metal layer to the second doped region, the second plurality of vias positioned such that they directly overlie the second contact.

8. The die seal structure of claim 7, wherein the substrate is a P type substrate, the first doped region is an N type region and the second doped region is a P type region, and wherein both the N type region and the P type region have a dosage of less than 6E13 ions/cm$^2$.

9. The die seal structure of claim 7, wherein the substrate is an N type substrate, the first doped region is a P type region and the second doped region is an N type region, and wherein both the N type region and the P type region have a dosage of less than 6E13 ions/cm$^2$.

10. The die seal structure of claim 7, wherein the first doped region and the second doped region extend completely around the integrated circuit devices.

* * * * *

UNITED STATES PATENT AND TRADEMARK OFFICE
CERTIFICATE OF CORRECTION

PATENT NO. : 7,560,800 B1
APPLICATION NO. : 11/459820
DATED : July 14, 2009
INVENTOR(S) : Lien et al.

It is certified that error appears in the above-identified patent and that said Letters Patent is hereby corrected as shown below:

Delete the title page and substitute therefore the attached title page consisting of corrected illustrative Fig 6.

In the drawings, drawing sheet 1 (FIG. 1), drawing sheet 2 (FIG. 2), drawing sheet 5 (FIG 5), drawing sheet 6 (FIG. 6) should appear as shown on the attached drawing sheets.

Column 8, claim 7, line 41, "contact extends" should read --contact that extends--.

Signed and Sealed this

Twentieth Day of April, 2010

David J. Kappos
*Director of the United States Patent and Trademark Office*

(12) United States Patent
Lien et al.

(10) Patent No.: US 7,560,800 B1
(45) Date of Patent: Jul. 14, 2009

(54) DIE SEAL WITH REDUCED NOISE COUPLING

(75) Inventors: Chuen-Der Lien, Los Altos Hills, CA (US); Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 94 days.

(21) Appl. No.: 11/459,820

(22) Filed: Jul. 25, 2006

(51) Int. Cl.
*H01L 29/06* (2006.01)

(52) U.S. Cl. .................. 257/619; 257/173; 257/508; 257/618; 257/758; 257/E23.194; 257/E21.575

(58) Field of Classification Search ............. 257/173, 257/620, 635, 637, 700, 758, 508, E23.194, 257/618, 619, E21.575
See application file for complete search history.

(56) References Cited

U.S. PATENT DOCUMENTS

| | | |
|---|---|---|
| 6,492,716 B1 | 12/2002 | Bothra |
| 2003/0071280 A1* | 4/2003 | Yu ............................ 257/200 |
| 2005/0098893 A1* | 5/2005 | Tsutsue et al ............. 257/758 |
| 2005/0110118 A1 | 5/2005 | Udupa |
| 2006/0206277 A1* | 9/2006 | Horch ......................... 702/82 |

* cited by examiner

*Primary Examiner*—Long K Tran
(74) *Attorney, Agent, or Firm*—Kenneth Glass; Glass & Associates

(57) ABSTRACT

A die seal structure for sealing integrated circuit devices formed on a semiconductor substrate. The die seal structure includes a die seal and a junction diode. The die seal only connects to the semiconductor substrate through the junction diode, thereby reducing noise coupling through the die seal. In another aspect of the present invention the die seal structure includes a die seal and a bipolar structure. In this embodiment the die seal only connects to the semiconductor substrate through the bipolar structure.

10 Claims, 6 Drawing Sheets